(12) United States Patent
Vobecky et al.

(10) Patent No.: US 8,803,192 B2
(45) Date of Patent: Aug. 12, 2014

(54) BIPOLAR NON-PUNCH-THROUGH POWER SEMICONDUCTOR DEVICE

(71) Applicant: ABB Technology AG, Zurich (CH)

(72) Inventors: Jan Vobecky, Lenzburg (CH); Munaf Rahimo, Uezwil (CH)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 13/850,732

(22) Filed: Mar. 26, 2013

(65) Prior Publication Data

US 2013/0207159 A1 Aug. 15, 2013

Related U.S. Application Data

(63) Continuation of application No. PCT/EP2011/066740, filed on Sep. 27, 2011.

(30) Foreign Application Priority Data

Sep. 27, 2010 (EP) ..................................... 10180161

(51) Int. Cl.
*H01L 29/06* (2006.01)
*H01L 29/10* (2006.01)
*H01L 29/74* (2006.01)

(52) U.S. Cl.
USPC ........................................ 257/171; 438/139

(58) Field of Classification Search
CPC ............... H01I 29/0661; H01I 29/0619; H01I 29/66136; H01I 29/8613; H01I 29/66363; H01I 29/0615
USPC .................... 257/171–172; 438/139
See application file for complete search history.

(56) References Cited

U.S. PATENT DOCUMENTS 3,231,796 A 1/1966 Shombert
4,079,403 A 3/1978 Temple
(Continued)

FOREIGN PATENT DOCUMENTS

EP 0 485 059 A2 5/1992

OTHER PUBLICATIONS

Notification Concerning Transmittal of International Preliminary Report on Patentability (Forms PCT/IB/326 and PCT/IB/373) and the Written Opinion of the International Searching Authority (Form PCT/ISA/237) dated Apr. 11, 2013, issued in corresponding International Application No. PCT/EP2011/066740. (9 pages).

(Continued)

*Primary Examiner* — Olik Chaudhuri
*Assistant Examiner* — Christine Enad
(74) *Attorney, Agent, or Firm* — Buchanan Ingersoll & Rooney PC

(57) ABSTRACT

An exemplary bipolar non-punch-through power semiconductor device includes a semiconductor wafer and a first electrical contact on a first main side and a second electrical contact on a second main side. The wafer has an inner region with a wafer thickness and a termination region that surrounds the inner region, such that the wafer thickness is reduced at least on the first main side with a negative bevel. The semiconductor wafer has at least a two-layer structure with layers of different conductivity types, which can include a drift layer of a first conductivity type, a first layer of a second conductivity type at a first layer depth and directly connected to the drift layer on the first main side and contacting the first electrical contact, and a second layer of the second conductivity type arranged in the termination region on the first main side up to a second layer depth.

25 Claims, 6 Drawing Sheets

(56) References Cited

U.S. PATENT DOCUMENTS

| | | | |
|---|---|---|---|
| 5,162,876 A | | 11/1992 | Kitagawa et al. |
| 5,710,442 A | * | 1/1998 | Watanabe et al. ............. 257/107 |
| 7,187,058 B2 | | 3/2007 | Schmidt |
| 7,304,363 B1 | * | 12/2007 | Shah ............................ 257/492 |
| 7,646,026 B2 | | 1/2010 | Friedrichs et al. |
| 2003/0038333 A1 | | 2/2003 | Satoh et al. |
| 2005/0156284 A1 | | 7/2005 | Schmidt |
| 2005/0258448 A1 | * | 11/2005 | Barthelmess et al. ........ 257/107 |
| 2007/0108558 A1 | | 5/2007 | Nemoto |
| 2008/0217627 A1 | | 9/2008 | Friedrichs et al. |
| 2010/0203710 A1 | | 8/2010 | Nemoto |

OTHER PUBLICATIONS

International Search Report (PCT/ISA/210) issued on Nov. 8, 2011, by the European Patent Office as the International Searching Authority for International Application No. PCT/EP2011/066740.

Euroean Search Report issued on Sep. 6, 2011.

Toru Hiyoshi et al., "Simulation and Experimental Study on the Junction Termination Structure for High-Voltage 4H-SiC PiN DIODES", IEEE Transactions on Electron Devices, vol. 55, No. 8, Aug. 1, 2008, pp. 1841-1846, XP-011231845.

* cited by examiner

BIPOLAR NON-PUNCH-THROUGH POWER SEMICONDUCTOR DEVICE

RELATED APPLICATION(S)

This application is a continuation under 35 U.S.C. §120 of International application PCT/EP2011/066740 filed Sep. 27, 2011, designating the U.S., and claiming priority to European application EP 10180161.1 filed in Europe on Sep. 27, 2010. The content of each prior application is hereby incorporated by reference in its entirety.

FIELD

The disclosure relates to the field of power electronics and more particularly to a bipolar non-punch-through power semiconductor device according to the preamble of claim 1 and a method for manufacturing such a semiconductor device

BACKGROUND INFORMATION

FIG. 1 shows a phase control thyristor according to a known implementation described in U.S. Pat. No. 5,710,442. In U.S. Pat. No. 5,710,442 a phase control thyristor (PCT) 10 is described with a wafer 2, on which on a cathode side 31 a cathode contact 3 can be arranged. An anode contact 4 is formed on an anode side 41 of the wafer opposite the cathode side 31. Within the wafer 2, there is an (n–) doped drift layer 26 arranged. On this drift layer 26 towards the cathode side 31 is a p doped base layer 5 provided, which contacts the cathode contact 3. (N+) doped cathode layers 7 and (p+) short regions 8 are embedded into the base layer 5. They also contact the cathode electrode 3. Lateral to the cathode contact 3 and separated from it by the drift layer 26 is a gate contact 95 arranged.

On the anode side 41, a p doped anode layer 6 can be arranged, which contacts the anode electrode 4. The cathode and anode sides 31, 41 shall be the plane, at which the outer side of the base layer 5 and the anode layer 6, respectively, are positioned and on which plane the contacts 3, 4 are arranged.

The wafer 2 has (e.g., comprises) an inner region 22 with a wafer thickness 23 measured between the cathode and anode side 31, 41 and a termination region 24, which surrounds the inner region 22. In the termination region 24, there are p doped first and second edge layers 58, 68 arranged with a lower doping concentration than the base layer 5 and the anode layer 6, respectively. The edge layers 58, 68 also terminate in a smaller depth 59, 69 than the base layer 5 and anode layer 6, respectively.

The base layer 5 is arranged up to a base layer depth 51, which depth is measured from the cathode side 31 and in orthogonal projection to it. The base layer 5 and first edge layer 58, which are arranged on the cathode side 31, have a base layer depth 51 and the first edge layer depth 59. The depths 51, 59 are measured as the distance of the maximum depth, to which the layers 5, 58 extend from the cathode side 31. The anode layer depth 61 and the second edge layer depth 69, which second edge layer 68 is arranged on the anode side 41, are measured from the anode side 41.

The edge layer thicknesses 50, 60 are measured as the maximum thickness of the layer in orthogonal projection to the cathode (or anode) side 31, 41. The edge layers 58, 68 have a thickness, which reduces continuously with rising distance from the inner region 22, e.g., the edge layers have a negative bevel 53. The surface of the wafer in the termination region 24 thereby forms a negative angle with the plane of the cathode side 31 or anode side 41, respectively.

As the angle, at which the thickness of the edge layers 50, 60 are reduced, is small (about 2°) in order to reduce the electric field slowly towards the lateral edge of the device, and as the base layer depth 51 is chosen to be deeper than the first edge layer depth 59, high losses are created in the inner region 22 (active area) of the device.

U.S. Pat. No. 7,187,058 describes a power diode with a steep negative bevel. The p+ doped base layer reaches to the edge of the device. A termination layer, which is weakly doped extends to the backside of the device such that it reaches the n+ doped layer at the backside.

Such a device has a "Junction Termination Extension" (JTE). The space charge region of the reverse biased p-n junction is being depleted along the low-doped termination layer towards the backsided n+ layer at the edge, which is the so-called Channel Stop.

The negative bevel makes the termination layer longer compared to a vertical device, which gives a higher breakdown voltage. The necessity to extend the termination layer to the opposite side means that it can only be applied to diodes, because of the diodes having an n doped layer on the backside and it means that the bevel is very steep in order to extend to the backside.

In EP 0 485 059 a known diode having a p+ type anode layer of 14-70 µm is described without disclosing any beveled termination structure. Also US 2007/108558 describes another known diode having an anode layer of 3 µm without beveled termination structure.

In U.S. Pat. No. 4,079,403 a thyristor with a one sided negative bevel which again extends to the other main side of the device, e.g., the device has a steep termination bevel angle. The base layer and anode layer extend to the lateral edges of the device. The layers are terminated in a constant depth from the first main side (which first main side is given as that plane to which the front sided surface of the wafer extends in the inner region).

SUMMARY

An exemplary bipolar non-punch-through power semiconductor device is disclosed comprising: a semiconductor wafer and a first electrical contact formed on a first main side of the wafer and a second electrical contact formed on a second main side of the wafer opposite the first main side; wherein said semiconductor wafer includes at least a two-layer structure with layers of different conductivity types, said at least two-layer structure having: a drift layer of a first conductivity type, a first layer of a second conductivity type directly connected to the drift layer towards the first main side and contacting the first electrical contact, and wherein said semiconductor wafer includes an inner region having a constant wafer thickness measured between the first and second main side and a termination region, which surrounds the inner region and in which the wafer thickness is reduced at least on the first main side by a negative bevel, wherein the first layer extends to a first layer depth, the first layer depth being measured from a plane, in which the first main side is arranged within the inner region and wherein the first layer laterally extends into the termination region, and wherein the drift layer extends to a drift layer depth, the drift layer depth being measured within the inner region from the plane, in which the first main side is arranged within the inner region, a second layer of the second conductivity type is arranged in the termination region on the first main side, the second layer being arranged up to a second layer depth, the second layer depth being measured from a plane, in which the first main side is arranged within the inner region, and in that the second layer depth is larger than the first layer depth and shallower than the drift layer depth, a maximum doping concentration of the second layer is lower than a maximum doping concentration of the first layer, and wherein the first layer depth is at most 45 µm.

An exemplary method for manufacturing a bipolar non-punch-through power semiconductor device, which comprises a first electrical contact on a first main side and a second electrical contact on a second main side opposite the first main side and at least a two-layer structure with layers of different conductivity types is disclosed, the method comprising: providing a wafer of a first conductivity type; creating a weakly doped second layer on the first main side by applying a first mask on the first main side, the first mask covering an inner region of the wafer; applying ions on the first main side in a termination region, which surrounds the inner region, and diffusing the ions in the termination region into the wafer up to a second layer depth; removing the first mask; creating a first layer, which is higher doped than the second layer, by applying ions on the first main side and diffusing the ions into the wafer into a first layer depth of at most 45 µm from the first main side, which first layer depth is lower than a second layer depth; and applying the first and second electrical contacts on the wafer on the inner region, then creating a negative bevel of the wafer on the first main side in the termination region by partly removing wafer material from the first main side in the termination region.

BRIEF DESCRIPTION OF THE DRAWINGS

The subject matter of the disclosure will be explained in more detail in the following text with reference to the attached drawings, in which.

DETAILED DESCRIPTION

Figure 1:
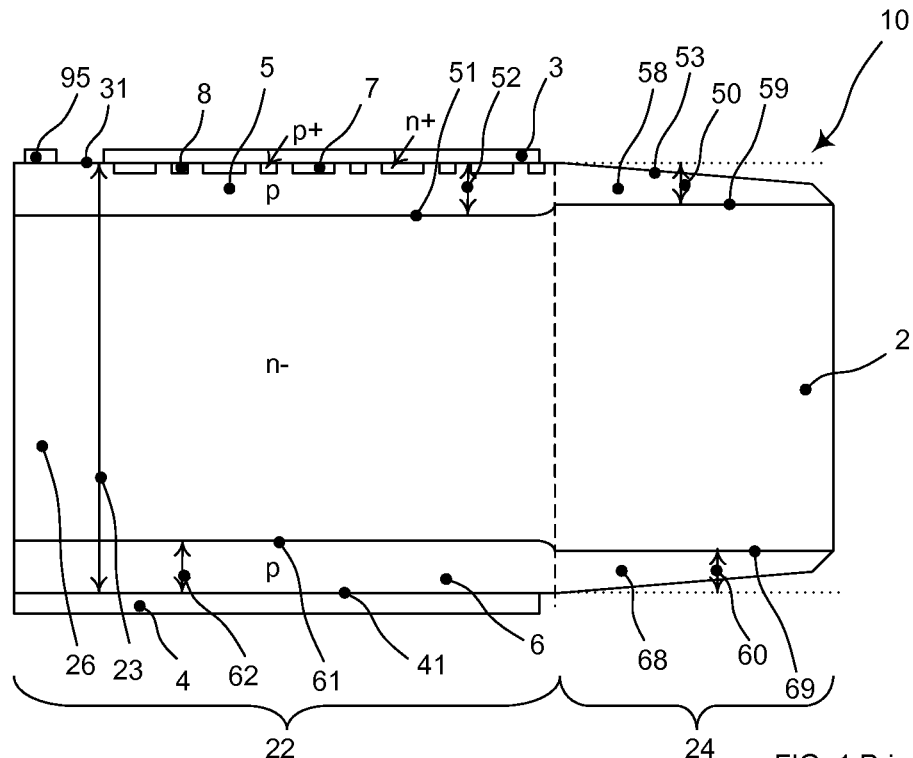
FIG. 1 shows a phase control thyristor according to a known implementation.

Exemplary embodiments of the present disclosure to provide a bipolar non-punch-through power semiconductor device with reduced losses and low on-state voltage drop VT and reverse recovery charge Qrr and to provide a manufacturing method for such a device.

The exemplary bipolar non-punch-through power semiconductor device described herein includes a semiconductor wafer and a first electrical contact formed on top of a first main side of the wafer and a second electrical contact formed on top of a second main side of the wafer opposite the first main side.

The semiconductor wafer includes at least a two-layer structure with layers of different conductivity types with a drift layer of a first conductivity type, a first layer of a second conductivity type arranged on and directly connected the drift layer towards the first main side and contacting the first electrical contact, which first layer is arranged up to a first layer depth, the first layer depth being measured as the maximum depth, to which the layer extends from the first main side and in orthogonal projection to the first main side.

As is known, a non-punch through power PCT is a device, in which the drift layer of the first conductivity type is in contact with the anode layer (third layer) without having a highly doped layer of the first conductivity type (called buffer layer) in between. The electric field in blocking condition for a non punch-through device is triangular and stops within the drift layer. The space charge region does not reach the anode layer.

A device having (e.g., including, comprising) such a buffer layer is called a punch-through device. At higher blocking voltages the electric field at the border between the drift and buffer layer will not have reached zero. Along a short distance in the buffer layer it is then steeply decreased to zero due to the high doping concentration.

The wafer includes an inner region with a wafer thickness measured between the first and second main side and a termination region, which surrounds the inner region and in which the wafer thickness is reduced at least on the first main side with a negative bevel. The wafer thickness is reduced from that outer side of the wafer, on which the first electrical contact is positioned, e.g., the wafer has a negative bevel, exemplarily with at least one angle. The surface of the wafer in the termination region thereby forms at least one negative angle with the plane of the first main side. In an exemplary embodiment, the bevel can extend to the edge of the device so that the wafer thickness is further and further reduced on its surface in the termination region with rising distance to the inner region.

A second layer of the second conductivity type is arranged in the termination region on the first main side up to a second layer depth. The second layer depth is measured as the maximum distance from the first main side, to which the second layer extends, and in orthogonal projection to the first main side. This second layer depth is larger than the first layer depth, whereas its doping concentration is lower than that of the first layer.

The first layer depth is at most 45 µm, exemplarily at most 30 µm. In an exemplary embodiment, the first layer depth can be up to at least 4 times, in another exemplary embodiment up to 10 times, or in yet another embodiment even at least 15 times lower than the second layer depth as desired.

Such devices are used for a blocking voltage of at least 1000 V, in particular of at least 1600 V. The given drift layer thicknesses ensure the operation of the device up to such blocking voltages.

In another exemplary embodiment of the disclosure, a wafer of a first conductivity type can be provided and a weakly doped second layer is created on the first main side by applying a first mask on the first main side, which covers an inner region of the wafer. Then ions are applied on the first main side in a termination region, which surrounds the inner region. The ions are diffused in the termination region into the wafer up to a second layer depth. Afterwards the first mask is removed.

Then a first layer, which is higher doped than the second layer, is created by applying ions on the first main side and diffusing the ions into the wafer into a first layer depth of at most 45 µm, and in one exemplary arrangement 30 µm from the first main side. Thus, the first layer depth is lower than a second layer depth. Then the first and second electrical contacts can be applied on the wafer on the inner region. A negative bevel of the wafer is created on the first main side in the termination region by partly removing wafer material from the first main side in the termination region. In case of the device having a four layered structure (e.g. thyristor) the same method can be applied for the creation of the layers on the second main side, exemplarily simultaneously with the layers on the first side, e.g., a second layer is created together with a fourth layer in the termination region and a first layer is created with a third layer as base and anode layer.

Such a manufacturing method is easy to perform because there are not many masks that should be specified. Though also the first (and third layer) extends into the termination region, its higher doping concentration is of little influence to the electrical properties because the highest doping concentration, which can be found on the surface of the plane wafer (before bevelling) is removed in the bevel step so that the doping concentration in the termination region drops quickly in lateral direction (in direction away from the inner region, e.g., parallel to the first main side) and in direction vertical to that direction, e.g., perpendicular from the first main side compared to the doping concentration in the inner region.

The reduced thickness of the first layer compared to known devices brings reduced on-state voltage drop (VT). Also other parameters like reverse recovery charge Qrr, turn-off time tq and maximal surge current are improved. Compared to known devices, this improvement can be achieved by aggressive thinning of the first layer. The total device thickness can be reduced due to the thinner first layer, while the reverse and forward blocking capability can be maintained by means of the modified junction termination with lightly-doped P-type termination layers and negative bevel. Maintaining the negative bevel has the advantage of robust reverse blocking up to the breakdown voltage, when significant current can flow through the junction termination at the periphery, but still not approaching the surface of a device. This condition, for example, can be specified for high avalanche lightning test capability in thyristors for HVDC, which can operate at high currents behind the knee of reverse I-V curve.

For example, a Phase Control Thyristor (PCT), compared to existing thyristors with common depth of layers of the second conductivity type (second edge layer and anode layer, or first edge layer and base layer, respectively) or even lower depths for the edge layers, has a lower on-state voltage drop (VT) up to very high currents with very high forward and reverse blocking capabilities at the same time. The lower VT implies for example a higher energy saving and selling price of a HVDC system, but can be also beneficial for other parameters in other applications.

With the present disclosure, a PCT can be processed at much thinner starting silicon wafer for a given voltage class, thus bringing a lower VT and Qrr. Because the PCT is non-punch-through device with symmetrical blocking, e.g., forward and reverse blocking, the application of a thinner drift layer with a field-stop (buffer) layer is not applicable. Consequently, the thickness of the drift layer should be conserved for a given voltage class. As provided in the present disclosure, the device can also have (e.g. include, comprise) aggressively thinned layers of the second conductivity type in the inner region on both main sides of the wafer, e.g., the anode and base layers. For example, the wafer thickness of a PCT with VRRM=8.5 kV can be reduced by about 10%, if the thicknesses of anode and P-base layers are reduced to about 25% of the thicknesses of known devices.

In order to maintain both the forward and reverse blocking at the level of a known device with thick anode and base layer, local deep termination layers of the second conductivity type can be used at the termination region. The deep termination layers can have junction terminations with a single or double negative bevel, which in principle provides high avalanche lightning capability specified in the HVDC applications.

While improving relevant device parameters (VT, Qrr, tq, and surge current capability), this disclosure keeps the other parameters relevant for HVDC, like avalanche lightning capability, at the level as for known devices.

Exemplary embodiments of the present disclosure also provide for the reduction of thermal budget (production cost), because the production of thinner layers can call for lower diffusion time. As the dopant deposition can replaced by ion-beam implantation, less high-temperature gettering (time) is specified hereby also saving the thermal budget.

The reference symbols used in the figures and their meaning are summarized in the list of reference symbols. Generally, alike or alike-functioning parts are given the same reference symbols. The described embodiments are meant as examples and shall not confine the disclosure.

Figure 2:
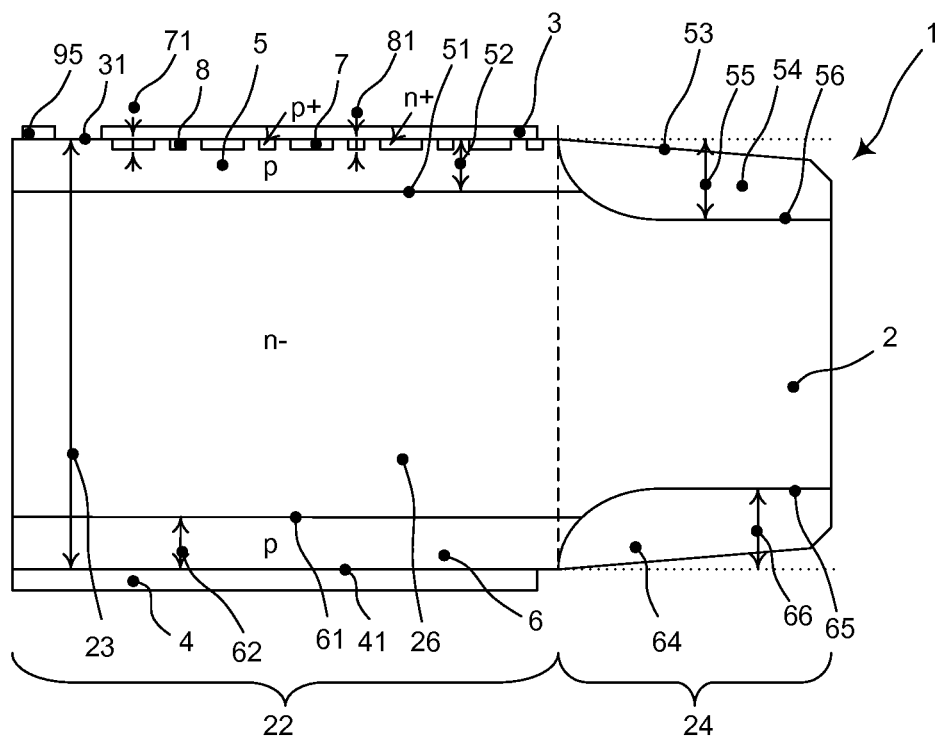
FIG. 2 shows a first phase control thyristor according to an exemplary embodiment of the present disclosure.

FIG. 2 shows a first phase control thyristor according to an exemplary embodiment of the present disclosure. As shown in FIG. 2, a bipolar non-punch-through power semiconductor device can be a phase controlled thyristor (PCT) 1 with a blocking voltage of at least 1000 V according to the disclosure is shown. The device can include a semiconductor wafer 2 with layers of different conductivity types. e.g., of opposite conductivity types, on which wafer 2 a cathode contact 3 is formed on a cathode side 31 of the wafer and an anode contact 4 is formed on an anode side 41 of the wafer opposite the cathode side 31. An (n−) doped drift layer 26 is formed in the wafer. A p doped base layer 5 is arranged on the drift layer 26 towards the cathode side 31. The base layer 5 contacts the cathode contact 3. The base layer 5 is arranged directly adjacent to the drift layer 26, such that no other intermediary layer of the second conductivity type is arranged between the base layer 5 and the drift layer 26. The base layer 5 and the drift layer 26 are connected to each other, e.g., they touch each other. The base layer 5 extends in the wafer 2 up to a base layer depth 51. The base layer depth 51 is measured as the maximum distance, to which the base layer 5 extends from the cathode side 31 and in orthogonal projection to the cathode side 31. In an exemplary embodiment, the base layer can be formed as a continuous layer having a constant base layer depth and the base layer 5 can extend into the termination region 24, e.g., the base layer depth 51 is also maintained in the termination region 24.

In any case, the cathode side 31 shall be the plane, in which the outer side of the base layer 5, e.g., that that side of the base layer 5, which is opposite to the drift layer 26, is positioned.

The wafer 2 can include an inner region 22 with a wafer thickness 23 measured as the maximum thickness in orthogonal projection between the cathode and anode side 31, 41 and a termination region 24, which surrounds the inner region 22 and in which the wafer thickness 23 is reduced at least on one side 31, 41. The first and second electrical contacts 3, 4 can be laterally terminated within the inner region 22.

A first p doped termination layer 54 can be arranged at the cathode side 31 in the termination region 24, which is arranged up to a first termination layer depth 55, the first termination layer depth 55 can be measured as the maximum distance from the cathode side 31, to which the first termination layer 54 extends, and in orthogonal projection to the cathode side 31. The first termination layer depth 55 is larger than the base layer depth 51, whereas the maximum doping concentration of the first termination layer 54 is lower than a maximum doping concentration of the base layer 5. For the base layer 5 extending into the termination region 24, the first termination layer 54 is arranged between the base layer 5 and the drift layer 26. The first layer can extend to the edge of the device. The maximum doping concentration of the base layer 5 is measured as the maximum doping concentration of that layer within the inner region, whereas the maximum doping concentration of the second layer shall be estimated as the maximum doping concentration of that layer which is overlapped with the doping concentration of the first layer in the termination region. That means that the maximum doping concentration of the second layer will be present in the termination region at or close to the surface of the wafer and at or close to the inner region. At that place, the bevel starts and therefore, the material has been removed, which means that the highest doping concentration can be maintained after the diffusing of ions for the creation of the first and second layer.

Within the termination region, in an area closer to the first main side, the first layer can be arranged, but the higher doping concentration part of the layer removed by the beveling (this part being overlapped with ions of the low-doped part mentioned in the following, e.g., this part is a double diffused layer) and a second part corresponds to a low doped part (second layer), which is arranged below the first part, e.g., which is arranged between the first layer and the drift layer in the termination region. The second layer can extend to the edge of the device.

The base layer depth 51 can be at most 45 μm, and in one exemplary arrangement at most 30 μm, and in another exemplary arrangement at most 25 μm or even below 20 μm as desired. The minimum base layer depth (in general the first layer depth) can be chosen such that the desired blocking voltage of the device is ensured.

Given that the exemplary device can be configured as a thyristor it is important that the termination region is terminated within the drift layer 26, because otherwise the anode would be connected to the base layer 5 and the device would work like a resistor made from a semiconductor of the second conductivity type and not as a thyristor anymore. Therefore, to realize thyristor functionality the deeper low doped termination layer should be finished in the drift layer and should not merge the anode layer. In an exemplary embodiment, the first termination layer 54 can extend to a depth of at most 20% of the depth of the drift layer.

The first layer can overlap with the second layer such that the first layer is formed as a continuous layer extending either partly into the termination region and even extending up to the lateral edge of the device (lateral shall mean in a plane perpendicular to the first main side). The first layer can extend to a constant depth, wherein the depth shall be measured from a plane, in which the first main side is arranged within the inner region. The second layer can be limited to an area in the termination region, and in an exemplary embodiment the second layer can extend in a plane parallel to the first main side over the whole area in the termination region 24. The second layer can be arranged below and thus between the first layer and the drift layer. The second layer shall be understood as that area in which only the driven-in ions of the second layer are present but no ions from the first layer. In the first layer part within the termination region ions from the first and second layer overlap as both ion sorts are diffused from the first side into the wafer. The maximum doping concentration of the second layer shall be understood as the maximum value of the doping concentration of the second conductivity type present in the termination region on the first main side, which exceeds the doping concentration of the first layer in the same depth in the inner region, e.g., which is added by diffusing ions for the second layer. This maximum value will be found close to the surface of the wafer and close to the border to the inner region. The second layer extends from the first main side to a greater depth than the first layer, but lower depth than the drift layer. In the figures, the overlap of the layers in the termination region is not indicated, but can be added by extending the border of the base layer 5 laterally to the edge of the device, thus overlapping the base layer 5 with the first termination layer 54.

In the context of the present disclosure, greater depth is meant as a greater depth from that plane, in which the first main side is arranged within the inner region. The maximum doping concentration of the second layer can be lower than that of the first layer (in the inner region). This means that the first layer is a highly doped, but shallow layer whereas the second layer is a lowly doped but deep layer.

In another exemplary embodiment of the present disclosure, the base layer depth 51 is up to at least 4 times, or in another exemplary embodiment 10 times or in yet another exemplary embodiment even at least 15 times lower than the first termination depth 55 as desired.

The first termination layer 54 can have a thickness 56 of less than 140 μm. In another embodiment the first termination layer has a thickness 56 of more than 50 μm.

A PCT has in addition to the before mentioned layers on the cathode side 31 an n doped cathode layer 7, which is embedded into the p doped base layer 5 such that the cathode electrode 3 contacts the base layer 5 and the cathode layer 7. Base layer 5 and cathode layer 7 terminate on the outer side of the wafer in the same plane. Alternatively, the cathode layer can project from the plane of the base layer 5.

A (p+) doped short region 8 can be arranged in the same plane as the p doped base layer 5 and lateral to the cathode layer 7. A gate contact 95 can be arranged on the cathode side 31 lateral to the cathode contact 3, but separated from it by the drift layer 26.

The base layer depth 51 is deeper than the cathode layer depth 71 and, if present, also deeper than the cathode short regions depth 81, so that the base layer 5 separates the cathode layer/cathode short regions 7, 8 from the drift layer 26. In an exemplary embodiment this is ensured by the base layer depth 51 (e.g., the base layer thickness 52) being at least 8 μm, and in another embodiment at least 10 μm as desired. The minimum depths of the layers also depends on the surface roughness of the wafer during the manufacturing process.

The wafer thickness 23 can be reduced in the termination region 24 on the cathode side 31 continuously, and in an exemplary embodiment up to the edge of the wafer. This result can be achieved as shown in FIG. 2 by the wafer surface declining from the plane of the cathode side 31 by two constant angles of at most 5° and 15°, in another exemplary embodiment by 3° and 15°, and in yet another embodiment by 1.5° and 15° as desired. The smaller angle (e.g., first angle) is the angle located closer to the inner region 22, whereas the larger angle (e.g., second angle) is the angle closer to the edge of the wafer. By such two declining angles a double negative bevel is formed.

The wafer thickness can also be reduced in the termination region 24 such that the wafer surface declines from the plane of the cathode side 31 by one single angle of at most 5°, thus resulting in a uniform thickness reduction, in another exemplary embodiment by 3°, and in yet another embodiment by 1.5°, as desired. The thickness of the wafer can be reduced in the termination region 24 continuously up to the edge of the wafer, such as at the bevel starting at the border to the inner region up to the edge of the wafer.

According to exemplary embodiments disclosed herein, also a thickness reduction with more than two angles is also possible, or any non-linear reduction of thickness. In an exemplary embodiment, the wafer thickness 23 can be further reduced on its surface in the termination region 24 with rising distance to the inner region 22, continuously.

In another exemplary embodiment of the present disclosure, the thickness of the termination layer can be chosen such that the termination layers extends up to the lateral side of the wafer, e.g., to the side perpendicular to the cathode or anode side 31, 41.

The first termination layer 54 is connected to the base layer 5 as shown in FIG. 2. The first termination layer 54 can also be directly connected to the cathode contact 3 or it can be terminated laterally to the cathode electrode 3 as shown in FIG. 2.

A PCT can include on its anode side 41 a p doped anode layer 6, which is arranged up to an anode layer depth 61 measured from the anode side 41 and in orthogonal projection to it. Due to the device being a non punch-through device, the drift layer 26 can be in contact with the anode layer 6, e.g., there is no highly doped buffer layer of the first conductivity type in between. The electric field can be stopped in blocking condition within the drift layer as a triangle. A p doped second termination layer 64 can be arranged in the termination region 24 on the anode side 41 up to a second termination layer depth 65 measured from the anode side 41 and in orthogonal projection to it. The second termination layer depth 65 can be arranged in a like manner as the first termination layer depth 55 larger than the anode layer depth 61

The anode layer depth 61 can be chosen like the base layer depth 51 to be at most 45 μm, and in other exemplary embodiments is 30 μm. In an exemplary embodiment of the disclosure, the anode layer depth 61 can be at least 8 μm, and in another exemplary embodiment at least 10 μm as desired. In an exemplary embodiment, the anode layer depth 61 can be up to at least 4 times, in another exemplary embodiment, up to 10 times or even up to at least 15 times lower than the second termination depth 65 as desired. The second termination layer 64 can have a thickness 66 of less than 140 μm. In another exemplary embodiment the second termination layer 64 can have a thickness 66 of more than 50 μm.

The second termination layer 64 can be connected to the anode layer 6 as shown in FIG. 2. The second termination layer 64 can also be directly connected to the anode electrode 3 or it can be terminated laterally to the anode electrode 3 (FIG. 2).

Figure 3:
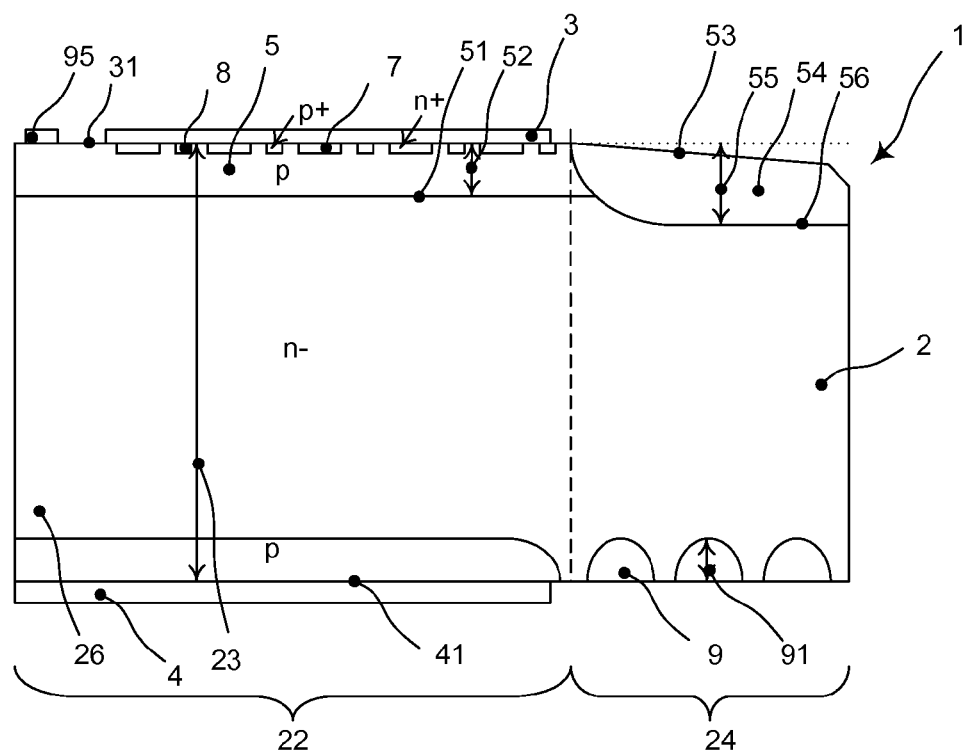
FIG. 3 shows a second phase control thyristor according to an exemplary embodiment of the present disclosure.

FIG. 3 shows a second phase control thyristor according to an exemplary embodiment of the present disclosure. In another exemplary embodiment, the device can have at least two or three guard rings, in yet another embodiment up to 20 or even 24 guard rings. Width and spacing of the guard rings can be optimized to achieve a high breakdown voltage. In an exemplary embodiment, the PCT can include on its anode side 41 a p doped anode layer 6 as described beforehand. Lateral to the anode layer 6 in the termination region 24, at least one p doped guard ring 9 can be arranged. In case of the device having a plurality of guard rings 9, they can be separated from each other by the drift layer 26 (FIG. 3). Thus, the guard rings 9 enclose each other. For such a device, there is no negative bevel 53 present of the wafer in the termination region 24 at the anode side 41, but the device thickness 23 is kept constant at the anode side 41. Also for this embodiment, the anode layer depth 61 can be chosen to be at most 30 μm. In order to limit the number of masks and steps for the deposition of dopants the guard rings 9 can have the same doping concentration as the anode layer 6. Alternatively, the guard rings 9 can have a doping concentration and/or depth different from the doping concentration and/or depth of the anode layer 6.

It is also possible to have such guard rings 9 as disclosed beforehand on the cathode side 31 and a thin anode layer 6 of less than 30 μm with a deeper second termination layer 64 and a negative bevel on the anode side 41.

In another exemplary embodiment, the inventive PCT device can include only on the cathode or anode side (first main side) a base or anode layer 5, 6 of at most 30 μm (first layer) and a deeper first or second termination layer 54, 64 (second layer) on the same side. The other side can be terminated by any structure shown in known devices.

Figure 4:
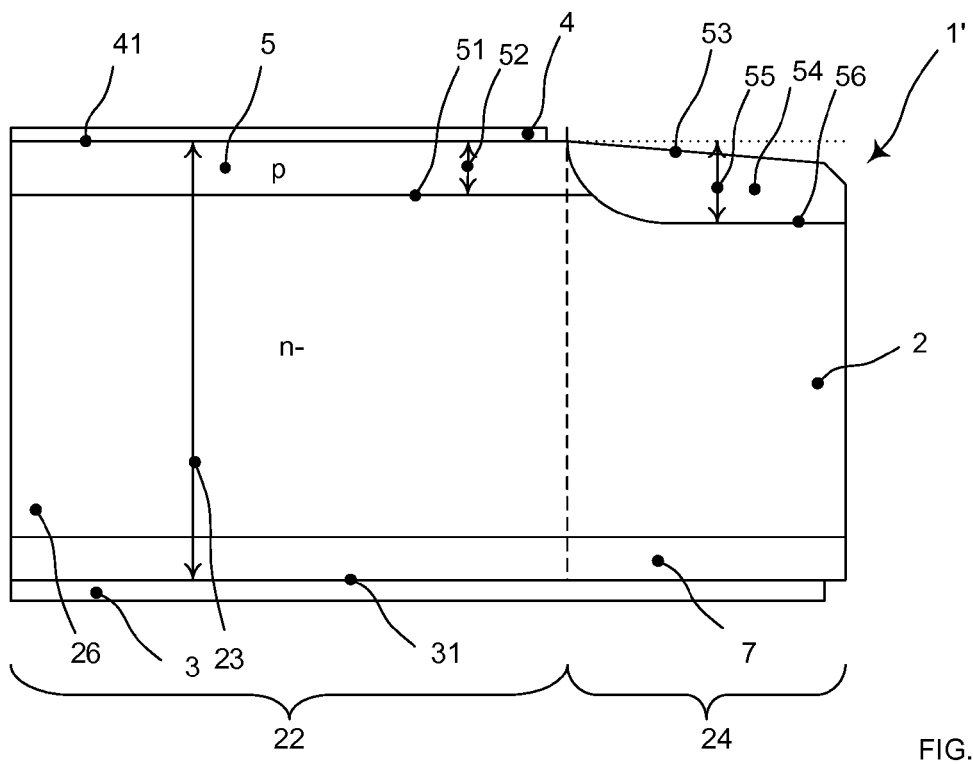
FIG. 4 shows a diode according to an exemplary embodiment of the present disclosure.

FIG. 4 shows a diode according to an exemplary embodiment of the present disclosure. As shown in FIG. 4, the diode 1' can include on an anode side 41 as disclosed beforehand a base layer 5, which functions as an anode layer for the diode and a first termination layer 54. Doping concentrations and depths of these layers are chosen as for an inventive PCT. On the cathode side 31, no p-doped layer is arranged. The drift layer 26 contacts the cathode electrode 3 through a cathode layer 7 with high donor concentration compared to the drift layer 26. The cathode layer 7 exemplarily extends as a continuous layer over the whole wafer area on the cathode side 31.

The disclosure can also be applied to a plurality of other semiconductor types like GCTs and reverse blocking GCTs.

The conductivity types of all layers can be reversed, e.g., the layers of the first conductivity type like the drift layer 26 are in this case p type and the layers of the second conductivity type like the base layer 5 are n type.

Figure 5:
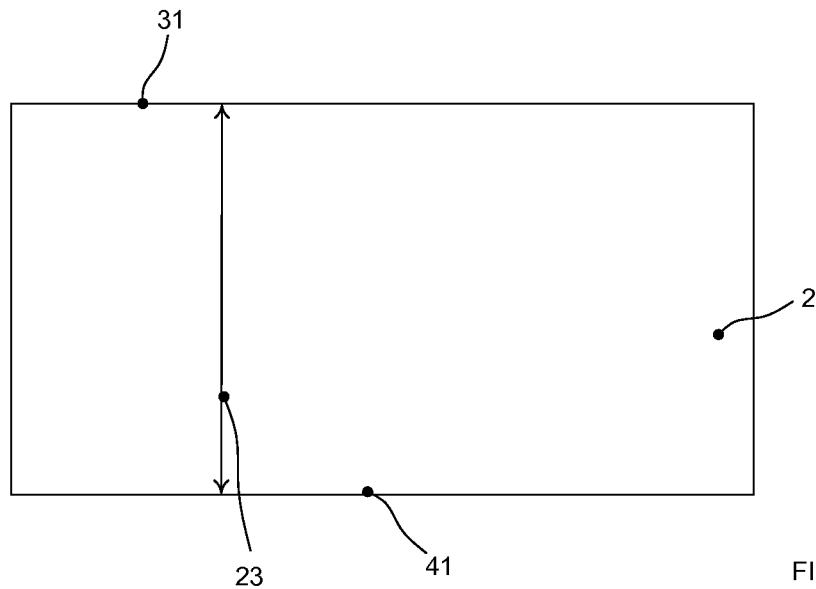
FIGS. 5-12 show different steps of a method for manufacturing a semiconductor device according to an exemplary embodiment of the present disclosure.
Figure 6:
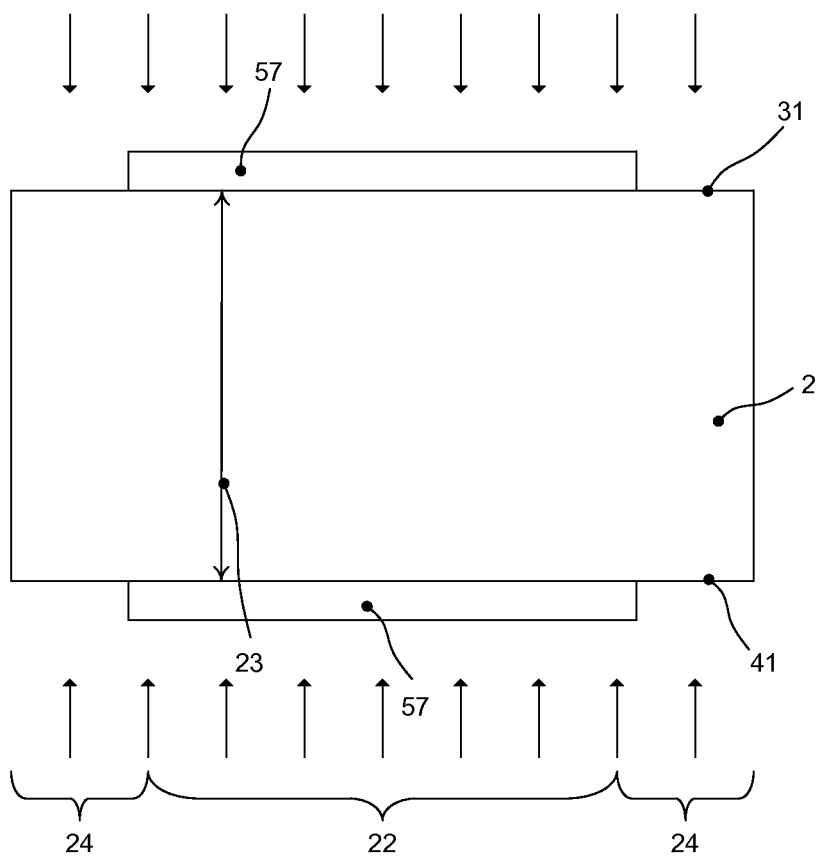

An exemplary PCT as provided in the present disclosure, which can include a cathode contact 3 on a cathode side 31 and an anode contact 4 on an anode side 41 opposite the cathode side 31 and at least a two-layer structure with layers of different conductivity types, can be manufactured by a method, which comprises at least the following manufacturing steps:

An (n−) doped wafer 2 with a cathode side 31 and an anode side 41 opposite to the cathode side 31 is provided (FIG. 5). A first termination layer 54 is created on the cathode side 31 by applying a first mask 57 on the cathode side 31, which first mask 57 covers an inner region 22 of the wafer. Then ions are applied, e.g. by ion implantation or deposition, on the cathode side 31 in a termination region 24, which surrounds the inner region 22 (FIG. 6). Afterwards the ions are diffused into the wafer 2 in the termination region 24, thus creating the first termination layer 54 (FIG. 7) and the first mask 57 is removed.

Figure 7:
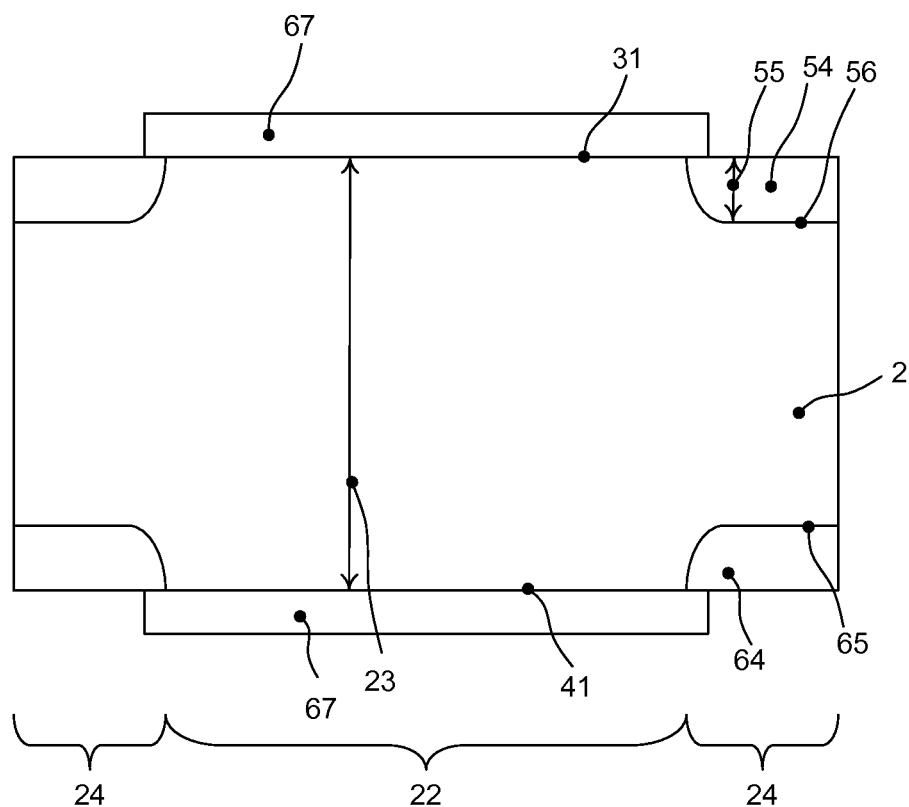
Figure 8:
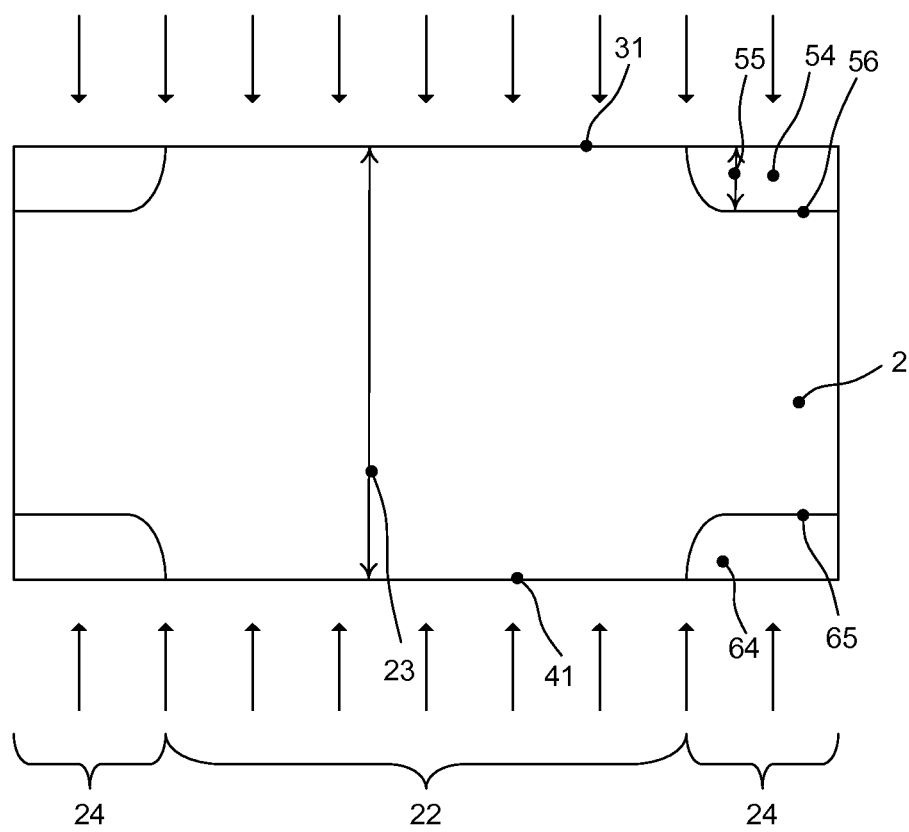

FIGS. 5-12 show different steps of a method for manufacturing a semiconductor device according to an exemplary embodiment of the present disclosure. A second termination layer 64 can be created on the anode side 41 in the same way by applying a second mask 67 on the anode side 41, which covers the inner region 22. Then ions are applied on the anode side 41 in the termination region 24, which surrounds the inner region 22, for example by implantation or deposition (FIG. 6). The ions are diffused into the wafer 2 in the termination region 24, thus the second termination layer 64 is created (FIG. 7). The second mask 67 is removed afterwards.

The first and second termination layers 54, 64 can be created one after the other or, as shown in the figures, they can be created simultaneously. Of course, also other manufacturing steps like separate implantation steps, but a common diffusion can be applied and the order for creation of the first and second termination layer be reversed.

Figure 9:
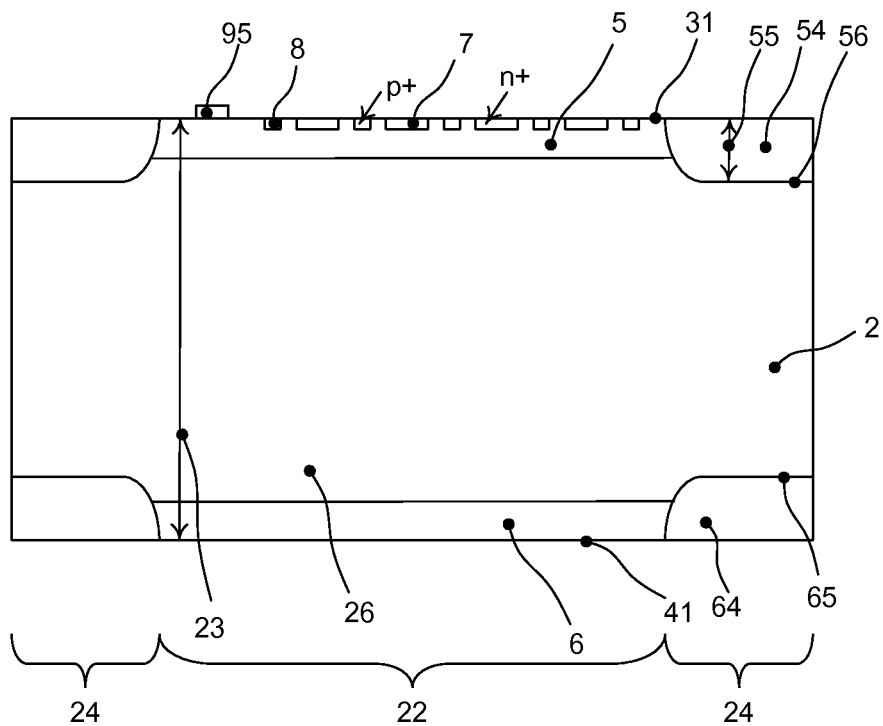

A base layer 5 is then created by applying ions on the cathode side 31, e.g. by ion implantation or deposition without a mask (FIG. 8), and then diffusing the ions into the wafer 2 into a depth 51 of at most 45 μm, in another exemplary embodiment of at most 30 μm from the cathode side 31, which depth is lower than a first termination layer depth 55 (FIG. 9). The first termination layer 54 can have a thickness

56 of less than 140 µm. In another exemplary embodiment the first termination layer 54 can have a thickness 56 of more than 50 µm.

An anode layer 6 can be created on the second main side 41 by applying ions on the anode side 41 and diffusing the ions into the wafer 2 into an anode layer depth 61, which is lower than a second termination layer depth 65. Also the base and anode layer 5, 6 can be created one after the other or they can be created completely or partly simultaneously, e.g. by implanting ions on a first side, afterwards on the other side and then diffusing the ions in one step into the wafer 2.

Other layers like an n+-doped cathode layer 7, a p-doped cathode short region and a gate contact 95 can be created on the cathode side 31 now or at any other appropriate manufacturing step by any method well-known by the experts (FIG. 9).

Figure 10:
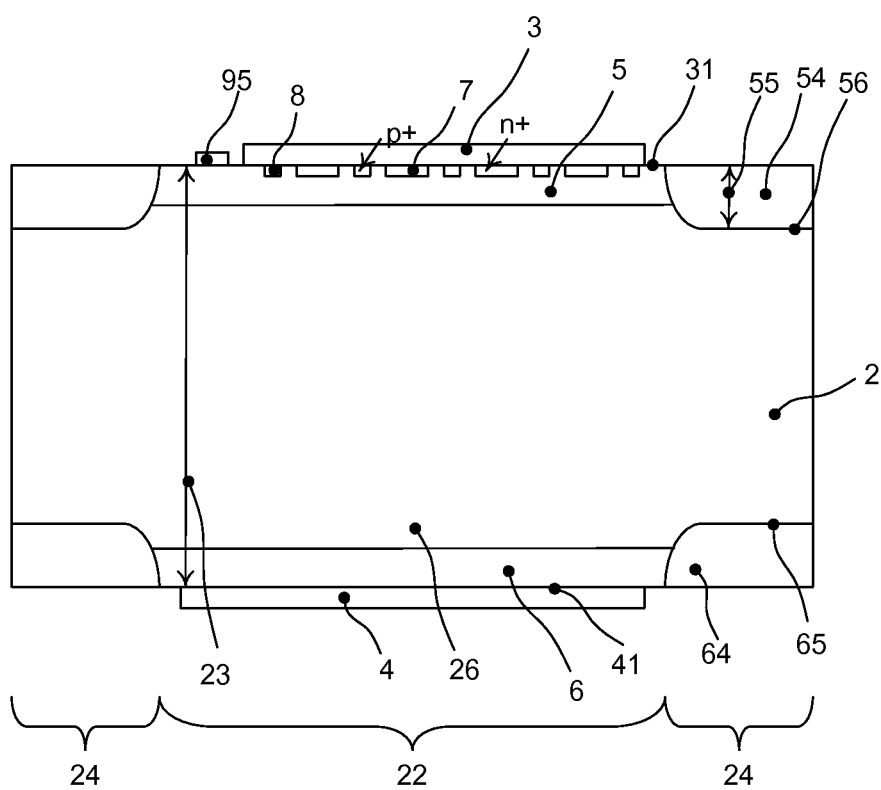
Figure 11:
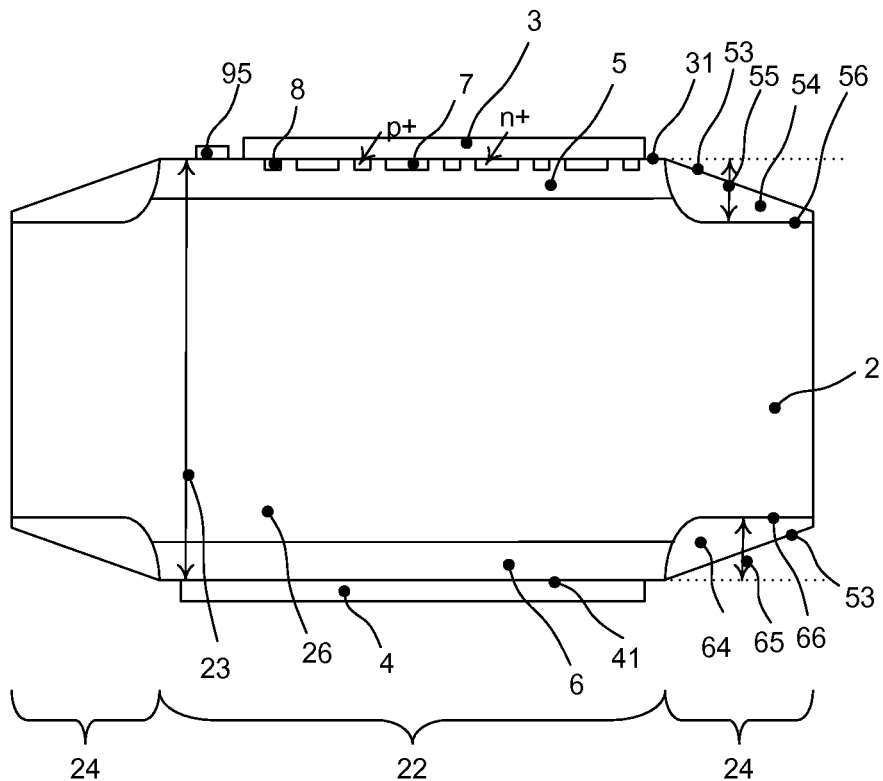
Figure 12:
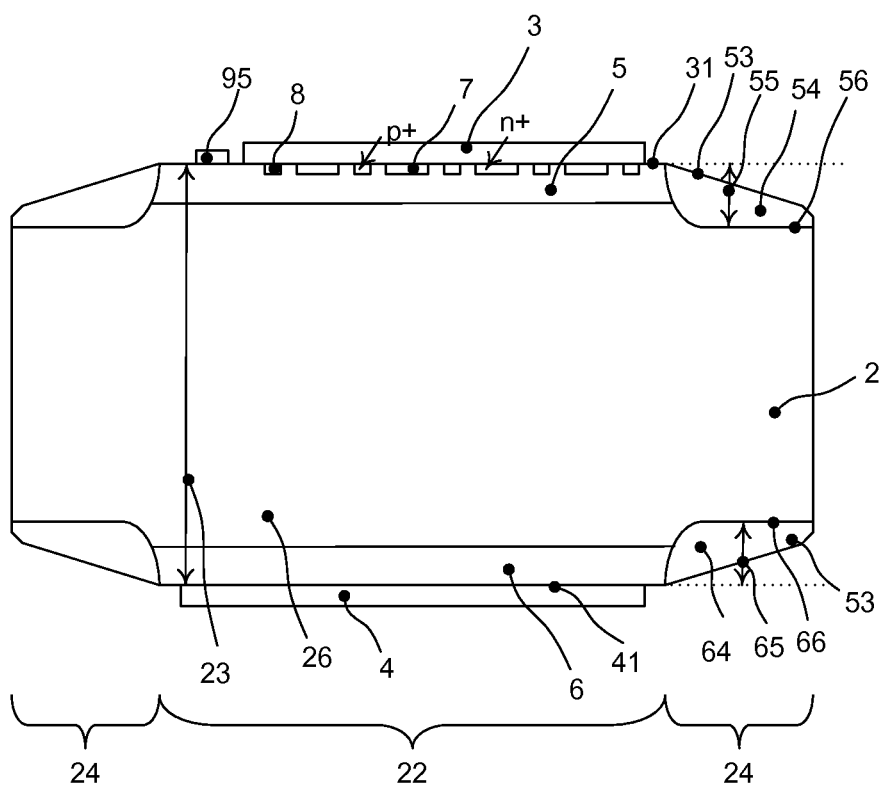

The cathode and anode contacts 3, 4 are then created on the wafer 2 in the inner region 22 (FIG. 10). Afterwards part of the wafer can be removed in the termination region 24 from the cathode side 31, for example by etching, grinding or lapping, such that a negative bevel 53 is formed with at least one angle declining from the cathode side 31 (or anode aside 41, respectively). Wafer material can be removed continuously to create in another exemplary embodiment a reduction of wafer thickness in the termination region 24 such that the wafer surface declines from the plane of the cathode side 31 by a single constant angle of at most 5°, thus resulting in a uniform thickness reduction, in another exemplary embodiment by 3°, and in yet another embodiment by 1.5°(FIG. 11) as desired.

In another exemplary embodiment of the present disclosure, wafer material can be removed continuously to create a reduction of wafer thickness 23 in the termination region 24 such that the wafer side declines from the plane of the cathode side 31 (or anode aside 41, respectively) by two constant angles of at most 5° and 15°, in another exemplary embodiment by 3° and 15°, and yet in another embodiment by 1.5° and 15°. By such a declining angle a double negative bevel is formed.

One angle for single negative bevel can be used for devices with lower breakdown voltage (for example up to 6.5 kV) and in an exemplary embodiment two angles for double negative bevel can be used for devices with higher breakdown voltages (for example above 6.5 kV). Of course, also non-linear bevels are possible to manufacture.

The exemplary PCT device of the present disclosure can also include only on one side, e.g., the cathode or anode side (first main side) a base or anode layer 5, 6 of at most 45 µm, or in another exemplary embodiment 30 µm (first layer) and a deeper first or second termination layer 54, 64 (second layer) with a negative bevel on the same side, that means that the before mentioned manufacturing steps are only performed on one side. The other side can be manufactured by any method and any structure known by experts (like guard rings 9).

If not stated otherwise in this application, all properties stated about the first and second layers in view of design or manufacturing method can also be applied for the third and fourth layer in case of the device having a four layered structure like for a thyristor, in an exemplary a PCT or GCT.

The exemplary embodiments of the present disclosure can also be applied to any kind of thyristors having four-layer structures like a GCT (gate commutated thyristor).

An exemplary diode can be manufactured in a similar way as the PCT, but there is only a p doped base layer 5 (anode layer for the diode) created on the anode side 41, whereas no p-doped layer is created on the cathode side 31 of the diode. Instead, there is a highly n doped cathode layer 7 created for a good contact on the cathode side 31.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

Reference List

1 Phase controlled thyristor
1' diode
10 Prior art PCT
2 Wafer
22 inner region
23 wafer thickness
24 termination region
26 drift layer
3 cathode contact
31 cathode side
4 anode contact
41 anode side
5 base layer
51 base layer depth
52 base layer thickness
53 negative bevel
54 first termination layer
55 first termination layer depth
56 first termination layer thickness
57 first mask
58 first edge layer
59 first edge layer depth
50 first edge layer thickness
6 anode layer
61 anode layer depth
62 anode layer thickness
64 second termination layer
65 second termination layer depth
66 second termination layer thickness
67 second mask
68 second edge layer
69 second edge layer depth
60 second edge layer thickness
7 cathode layer
71 cathode layer depth
8 cathode short region
81 cathode short region depth
9 Guard ring
91 Guard ring depth
95 Gate contact

What is claimed is:

1. A bipolar non-punch-through power semiconductor device comprising:
a semiconductor wafer and a first electrical contact formed on a first main side of the wafer and a second electrical contact formed on a second main side of the wafer opposite the first main side;
wherein said semiconductor wafer includes at least a two-layer structure with layers of different conductivity types,
said at least two-layer structure having:
a drift layer of a first conductivity type,
a first layer of a second conductivity type directly connected to the drift layer towards the first main side and contacting the first electrical contact, and wherein said semiconductor wafer includes an inner region having a constant wafer thickness measured between the first and second main side and a termination region, which surrounds the inner region and in which the wafer thickness is reduced at least on the first main side by a negative bevel, wherein the first layer extends to a first layer depth, the first layer depth being measured from a plane, in which the first main side is arranged within the inner region and wherein the first layer laterally extends into the termination region, and wherein the drift layer extends to a drift layer depth, the drift layer depth being measured within the inner region from the plane, in which the first main side is arranged within the inner region, a second layer of the second conductivity type is arranged in the termination region on the first main side, the second layer extending to the edge of the device, the second layer being arranged up to a second layer depth, the second layer depth being measured from a plane, in which the first main side is arranged within the inner region, and in that the second layer depth is larger than the first layer depth and shallower than the drift layer depth, a maximum doping concentration of the second layer is lower than a maximum doping concentration of the first layer, and wherein the first layer depth is at most 45 μm.

2. The semiconductor device according to claim 1, wherein the first layer depth is at most 30 μm.

3. The semiconductor device according to claim 1, comprising:
on the first side a cathode layer of the first conductivity type, which is arranged such that the first electrical contact contacts the first layer and the cathode layer;
on the second main side a third layer of the second conductivity type, which is arranged up to a third layer depth measured from the second main side; and
a fourth layer of the second conductivity type is arranged in the termination region on the second main side up to a fourth layer depth measured from the second main side, wherein the fourth layer depth is larger than the third layer depth.

4. The semiconductor device according to claim 3, wherein the third layer depth is at most 30 μm.

5. The semiconductor device according to claim 3, wherein the third layer depth is at most 45 μm.

6. The semiconductor device according to claim 3, wherein at least one of the first layer depth is up to at least four times lower than the second layer depth, and the third layer depth is up to at least four times lower than the fourth layer depth.

7. The semiconductor device according to claim 6, wherein the first layer depth is up to ten times lower than the second layer depth.

8. The semiconductor device according to claim 6, wherein the third layer depth is up to ten times lower than the fourth layer depth.

9. The semiconductor device according to claim 3, wherein at least one of the first and the third layer depth is at least 8 μm.

10. The semiconductor device according to claim 9, wherein at least one of the first and the third layer depth is at least 10 μm.

11. The semiconductor device according to claim 3, wherein at least one of the second layer is connected to the first layer and the fourth layer is connected to the third layer.

12. The semiconductor device according to claim 3, wherein at least one the second layer is connected to the first electrical contact and the fourth layer is connected to the second electrical contact.

13. The semiconductor device according to claim 3, wherein the fourth layer has a lower maximum doping concentration than the third layer.

14. The semiconductor device according to claim 3, comprising:
on one of the first or second main side a cathode layer of the first conductivity type with a cathode layer depth, and the first or third layer depth, which is arranged at the main side on which the cathode layer is arranged, is larger than the cathode layer depth.

15. The semiconductor device according to claim 1, wherein the wafer thickness is reduced in the termination region with a negative bevel, which has a single angle or with a first angle closer to the inner region and a second angle closer to the edge of the wafer, wherein the second angle is larger than the first angle.

16. The semiconductor device according to claim 15, wherein the single angle and the first angle are at most 5° and the second angle is at most 15°.

17. The semiconductor device according to claim 1, wherein the first layer is a continuous layer having a constant first layer depth, and the second layer is arranged between the first layer and the drift layer.

18. The semiconductor device according to claim 1, comprising:
a third layer of the second conductivity type, which is arranged on the second main side up to an third layer depth measured from the second main side, and guard rings of the second conductivity type are arranged on the second main side in the termination region.

19. The semiconductor device according to claim 1, wherein the thickness of the wafer is reduced continuously in the termination region up to the edge of the device.

20. The semiconductor device claim 1, wherein the second layer has a thickness in a range of at least 50 μm and up to 140 μm.

21. A method for manufacturing a bipolar non-punch-through power semiconductor device, which comprises a first electrical contact on a first main side and a second electrical contact on a second main side opposite the first main side and at least a two-layer structure with layers of different conductivity types, the method comprising:
providing a wafer of a first conductivity type;
creating a weakly doped second layer on the first main side by applying a first mask on the first main side, the first mask covering an inner region of the wafer;
applying ions on the first main side in a termination region UP to the edge of the wafer, which surrounds the inner region, and diffusing the ions in the termination region into the wafer up to a second layer depth;
removing the first mask;
creating a first layer, which is higher doped than the second layer, by applying ions on the first main side and diffusing the ions into the wafer into a first layer depth of at most 45 μm from the first main side, which first layer depth is lower than the second layer depth; and
applying the first and second electrical contacts on the wafer on the inner region, then creating a negative bevel of the wafer on the first main side in the termination region by partly removing wafer material from the first main side in the termination region.

22. The method according to claim 21, wherein the first layer is created by applying ions on the first main side and diffusing the ions into the wafer into a first layer depth of 30 μm.

23. The method according to claim 21, comprising:
creating a fourth layer on the second main side by:
- applying a second mask on the second main side, which covers the inner region;
- applying ions on the second main side in the termination region, which surrounds the inner region;
- diffusing the ions into the wafer in the termination region up to a fourth layer depth;
- removing the second mask;
- creating a third layer on the second main side by applying ions on the second main side and diffusing the ions into the wafer into a third layer depth, which is lower than a fourth layer depth; and
- creating a negative bevel of the wafer on the second main side in the termination region by partly removing wafer material from the second main side in the termination region.

24. The method according to claim 21, wherein at least one of the second layer has a depth of less than 140 μm and the fourth layer has a depth of less than 140 μm.

25. The method according to claim 21, wherein at least one of the first termination layer has a depth of more than 50 μm and that the second termination layer has a depth of more than 50 μm.

* * * * *